United States Patent [19]
Abbey

[11] Patent Number: 5,615,411
[45] Date of Patent: Mar. 25, 1997

[54] METHOD AND APPARATUS FOR COMPOSITE SIGNAL SEPARATION AND FM DEMODULATION

[75] Inventor: Duane L. Abbey, Cedar Rapids, Iowa

[73] Assignee: Rockwell International, Seal Beach, Calif.

[21] Appl. No.: 231,566

[22] Filed: Apr. 22, 1994

[51] Int. Cl.⁶ ................................................. H04B 7/10
[52] U.S. Cl. .................... 455/206; 455/303; 455/337; 329/316; 375/327
[58] Field of Search .................... 455/337, 314–317, 455/60, 61, 63, 65, 132, 133, 140, 134–136, 260, 206, 209, 296, 302, 303, 304, 305, 312; 375/327, 342; 329/316, 36

[56] References Cited

U.S. PATENT DOCUMENTS

| | | | |
|---|---|---|---|
| 4,015,205 | 3/1977 | Ikeda et al. | 375/347 |
| 4,222,051 | 9/1980 | Kretschmer, Jr. | 343/100 |
| 4,361,906 | 11/1982 | Sakamoto | 455/140 |
| 4,388,730 | 6/1983 | Nash et al. | 455/208 |
| 4,457,007 | 6/1984 | Gutleber | 375/102 |
| 4,547,737 | 10/1985 | Gibson | 329/50 |
| 4,620,160 | 10/1986 | Waggener | 329/104 |
| 4,736,392 | 4/1988 | Kammeyer et al. | 375/80 |
| 4,823,398 | 4/1989 | Hashimoto | 455/140 |
| 4,910,468 | 3/1990 | Ohtsuka et al. | 329/316 |
| 4,910,469 | 3/1990 | Takahashi | 329/320 |
| 4,992,747 | 2/1991 | Myers | 455/206 |
| 5,065,107 | 11/1991 | Kumar et al. | 329/308 |
| 5,457,711 | 10/1995 | Kellermann | 455/133 |

*Primary Examiner*—Reinhard J. Eisenzopf
*Assistant Examiner*—Philip J. Sobutka
*Attorney, Agent, or Firm*—Kyle Eppele; M. Lee Murrah; George A. Montanye

[57] ABSTRACT

A composite signal recognizer, separator, and FM demodulator apparatus for processing received radio signals. The receiver utilizes N demodulators to process a received signal, where N is equal to or greater than the number of co-channel signals or perceived interference. Detailed in both cross-coupled and cascaded fashion, the receiver first tracks to a predominant (stronger) signal, and regeneratively improves track on other (weaker) signals by subtracting the predominant signal or the predominant noise portion from the input of further demodulation stages.

8 Claims, 3 Drawing Sheets

METHOD AND APPARATUS FOR COMPOSITE SIGNAL SEPARATION AND FM DEMODULATION

BACKGROUND OF THE INVENTION

This invention relates to frequency modulation (FM) systems for receiving voice and data signals and more particularly to the detection and suppression of interference in such systems.

A variety of apparatus and techniques currently exist for processing FM signals in communication systems. In those situations in which the signal-of-interest has co-channel interference or more than one co-channel signal is desired, prior art solutions to such instances may not effectively separate the signals, and where separable, generally require duplicative equipment and increased processing time.

A typical receiver is comprised of one or more phase-locked loops (PLL) that may include fixed signal limits. The PLL may take the form of an analog or digital implementation, depending upon design choice and available resources. Generally, a PLL is dedicated to suppress noise by locking to and filtering the signal. The PLL contains a voltage-controlled oscillator, whose output could be multiplied with the input signal and integrated to establish a relative measure of noise level in the input signal. Additional PLLs may be included that are bandwidth tailored for the specific demodulation scheme desired. Some such systems may include a threshold (or thresholds) above which the detected noise level will cause the output to be squelched.

Yet another approach to signal processing is based upon the Hilbert transform. The Hilbert transform is a well-known mathematical principle, commonly used in signal processing, that is here used to translate the IF signal carrier to complex baseband in-phase (I) and quadrature-phase (Q) signal components. The Hilbert transform is often implemented from a real sampling of the IF signal carrier and then separated into I and Q channels, sometimes without quadrature carrier multiplies. Not using quadrature carrier multiplies relies on a fixed sample rate to carrier frequency relationship which can suffer from degraded performance, especially when the input signal is offset in frequency by Doppler shift and reference inaccuracies. The baseband signal demodulator then essentially becomes a hardware implementation of the premise that an FM signal can be processed from the derivative of its carrier phase.

Yet another prior art approach to multi-path interference problems, is based on the use of a plurality of canceler stages. Each canceler stage delays the input signal pulse by a fixed interval, typically equal to the pulse width. Next, the level of the undelayed main pulse is adjusted to equal the level of the first reflection pulse. This value is then subtracted from the delayed pulse. The process repeats for additional stages, as design requirements indicate, until the remaining reflections are suppressed an adequate amount. This approach is only good for well defined multi-path delay times and relatively short duration pulse signals.

Accordingly, a need exists for a communication architecture and processing method that is capable of efficiently handling arbitrary co-channel signal interference with minimal hardware requirements.

SUMMARY

A signal processing apparatus and method of demodulation and suppression of co-channel interference and multi-path communication signals is disclosed. An input signal is routed to a plurality of cross-coupled or cascadely-coupled demodulator stages for signal-of-interest processing. The demodulators may be of digital construction. Each demodulator has its output coupled to means for performing signal recognition and means for accomplishing demodulator control. By iteratively subtracting the "recognized" interfering signal from subsequent demodulator input signals, the receiver can quickly process the desired signal. Means for switching the processed demodulated signals among the plurality of demodulators and providing signal filtering, may also be included in the signal processing apparatus. An output signal that represents the demodulated frequency, amplitude, and/or phase of the signal-of-interest, less interfering co-channel noise or other signals, is then coupled to traditional receiver means for further processing, manipulation or monitoring.

It is, therefore, an object of the present invention to provide an apparatus for accomplishing composite communication signal processing.

It is a feature of the present invention that the disclosed apparatus includes a plurality of demodulator stages.

It is another feature of the present invention that the demodulator stages are implemented in digital configurations.

It is an advantage of the present invention that an input signal having co-channel interference can be quickly processed to enhance signal-to-interference ratio performance as contrasted to prior art techniques.

The foregoing as well as other objects, features and advantages of the present invention will become better understood from the following detailed description taken in conjunction with the various views of the appended drawings.

DETAILED DESCRIPTION OF THE DRAWINGS

Figure 1:
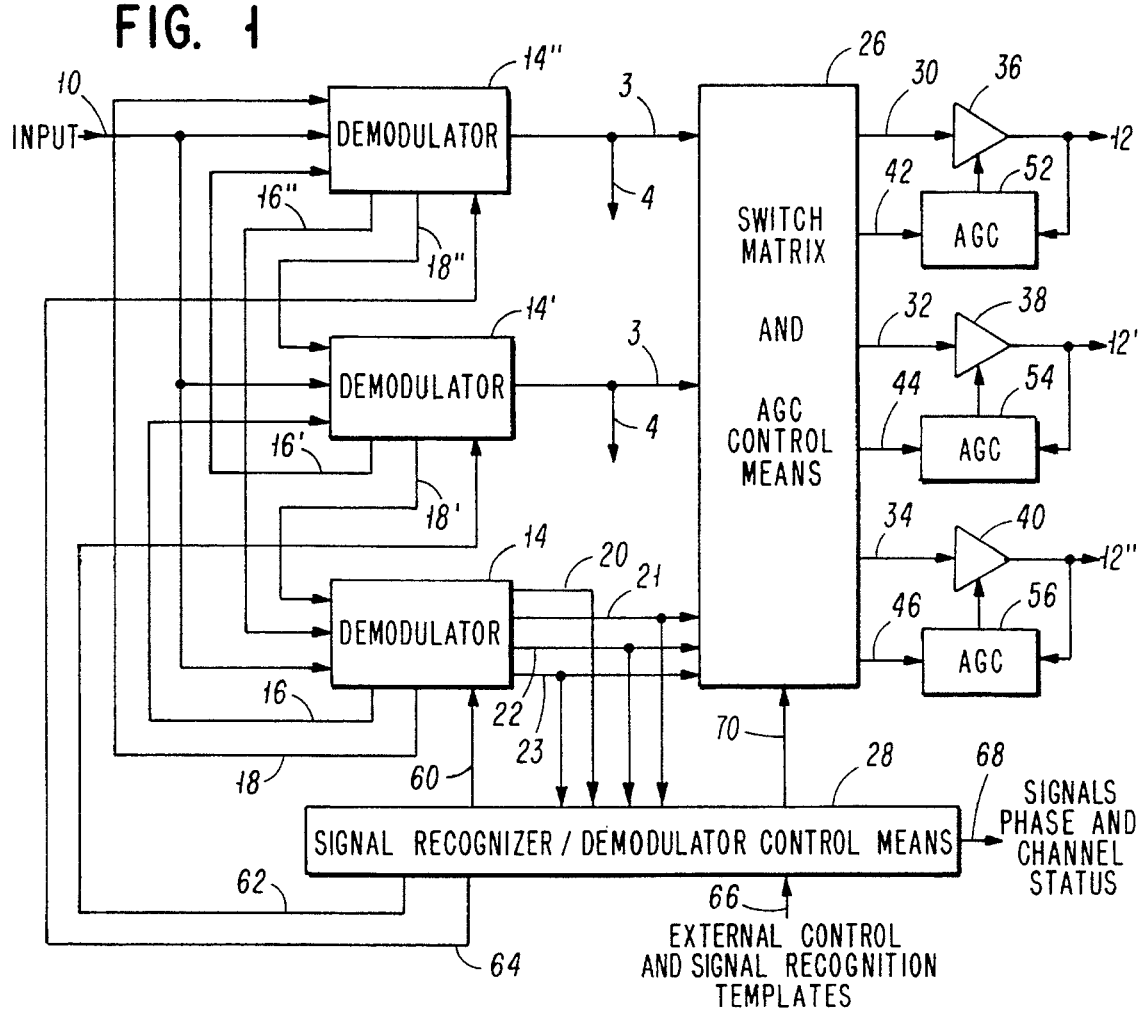
FIG. 1 is a block diagram of a portion of a receiver apparatus having a plurality of cross-coupled demodulator stages.

Turning now to the drawings wherein like items are referenced as such throughout, FIG. 1 illustrates a block diagram of a portion of a receiver for processing an input signal 10 to a desired output signal 12 (12', 12"). The input signal 10 is assumed to be a signal having co-channel interference that may take the form of noise or conflicting signals. The input signal 10 is coupled to a plurality of demodulators 14, 14', 14". Although three demodulators 14, 14', 14" are shown, it is understood that any number of demodulators in excess of one, can implement the operational method of the apparatus of FIG. 1. Each demodulator 14, 14', 14" generates two output signals 16, 18 representative of the resynthesized input signal 10 from the demodulated output, that is cross-coupled as signal inputs to the other two demodulators.

The demodulator 14 has three output signals 21, 22, 23 that are each coupled to means for switching and implementing automatic-gain-control (AGC) 26 and means for accomplishing signal recognition and demodulator control 28. A fourth demodulator output signal 20 is also coupled to the means for signal recognition and demodulator control 28. The output signals 20–23 are representative of the carrier phase, amplitude modulation, frequency modulation and phase modulation. The demodulators 14', 14" also have four similar outputs that are coupled to the means for switching and implementing AGC 26 and means for signal recognition and demodulator control 28, but for purpose of clarity are shown in an abbreviated format. Output signals 30, 32, 34 from means 26 are coupled to a plurality of amplifiers 36, 38, 40 that yield the output signals 12, 12', 12". Also, shown are control signals 42, 44, 46 coupled to means for performing AGC 52, 54, 56 and are coupled from signals 12, 12', 12', as depicted. The means for accomplishing signal recognition and demodulation control 28 may also have means for external control and signals recognition parametrics inputs 66. The means 28 may also provide external outputs relating to the signals presence status and carrier phase of each of the three channels.

In operation, the apparatus of FIG. 1 processes the input signal 10 by systematically combining such signal with the inverse of the synthesized signals 16, 18, 16', 18', 16", 18". Means 28 has control signals 60, 62, 64 coupled to the demodulators 14, 14', 14". The demodulators, with appropriately controlled gain and bandwidth will typically track a predominant signal of compatible bandwidth. The processed outputs of signal 10 are routed to means 28 for recognition purposes. Upon detection of signal presences, means 28 routes the synthesized output signal 16, 18, 16', 18', 16", 18", as related to the recognized signal(s), into the other demodulators, so that the output(s) of the other demodulator(s) is an improved output signal of the noise and interference rejected by the first demodulator(s) output. The three demodulators can in this fashion systematically and regeneratively separate and demodulate the input signal 10 into three different co-channel signals 12, 12', 12", or up to two different co-channel signals and random channel noise.

Figure 2:
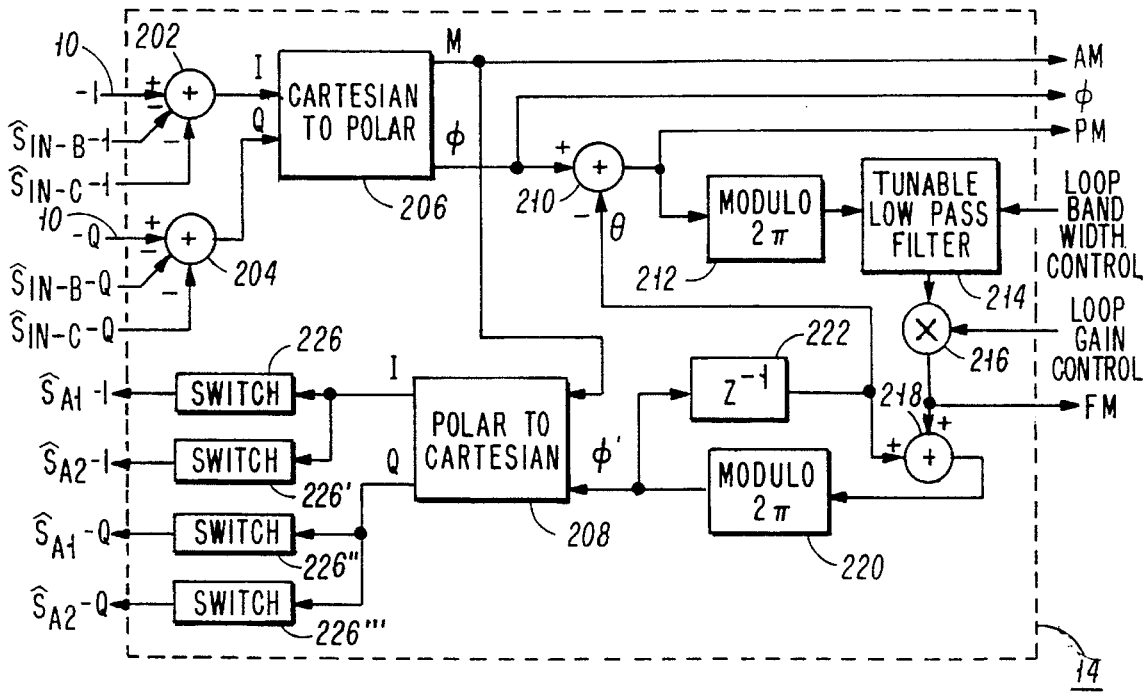
FIG. 2 is a block diagram of one embodiment of a digital implementation of a demodulator stage of FIG. 1.

FIG. 2 illustrates one embodiment of the demodulators 14, 14', 14" of FIG. 1, specifically 14. A pair of signed summers 202, 204 passes an in-phase signal component I and a quadrature-phase signal component Q of the original input signal 10. Signals I and Q are coupled to means for performing cartesian-to-polar conversion 206. The outputs of means 206 are magnitude M and phase $\phi$. The magnitude signal M is routed to switch/AGC means 26 and signal recognizer/demodulator control means 28 (both shown in FIG. 1) as the AM measurement of signal 10. Signal M is also coupled to means for performing polar to cartesian conversion 208.

Signal $\phi$ is also routed to signal recognizer/demodulator control means 28 and to a subtracter 210. The output signal of the subtracter 210 is routed through a phase normalizer 212, a filter 214, a multiplier 216, a summer 218 and a second phase normalizer 220. The output signal $\phi'$ of device 220 is coupled to means 208 and also to the summer 218 and subtracter 210 through means for delaying 222. The outputs of means 208 are coupled through switching means 226, 226', 226", 226''' and on to the additional demodulators 14', 14" and signed summers 202, 204 (shown in FIG. 1).

The above process is provided as described in more detail hereinafter. The cross-coupled multiple demodulator scheme of FIG. 1 provides improved signal processing of up to three signals occupying the same channel. One possible operational sequence has the input signal 10 passed to the demodulator 14. The demodulator 14 tracks or "locks-on-to" a primary component signal of signal 10. Reception of the primary component signal may well suffer extreme distortion due to the presence of noise and co-channel interference signals. The demodulator 14 of FIG. 2 assumes an I component (in-phase) signal input $10_I$ and a Q component (quadrature-phase) signal input $10_Q$. Both of these components are translated to their polar coordinates, thereby yielding a magnitude signal M and a phase signal $\phi$. The magnitude signal M represents the AM content of input signal 10. Signal M is routed to the switch/AGC means 26 and translated back (using $\phi'$) to its cartesian equivalent for switching to the demodulators 14', 14". The signal $\phi$ is routed through the phase-locked loop, described above, and yields $\phi'$, a cleaned-up synthesized $\phi$. Additionally, signal $\phi'$ (using M), is translated to its cartesian equivalent and made available to the demodulators 14', 14" via switching means 226 that is controlled by the signal recognizer/demodulator control means 28.

The output signals of the demodulator 14 are shown in FIG. 1 routed to signal recognizer/demodulator control means 28. Means 28 has available a variety of desired signal parameters. When means 28 detects a recognized signal presence contained in its input signals 20–23 (FIG. 1), it causes the synthesized signal outputs $16_I$, $18_I$, and 16Q, 18Q to be switched to demodulators 14', 14". The demodulators 14', 14" then subtract the I and Q inputs from demodulator 14 in its signed summers 202, 204 prior to any demodulation processing. In this manner, the demodulators 14', 14" can more effectively track and clean-up the residual interference signals and noise components of the input signal 10. The synthesized I and Q components from demodulators 14', 14" are subsequently switched to the demodulator 14 where the demodulated and resynthesized interference signals and noise components are subtracted, and the demodulator 14 can improve its ability to track its currently demodulated signal. Similarly, the synthesized outputs are switched and cross-coupled to each other's input signed summers 202, 204 to further regenerate and improve the isolation of the components of the input signal 10 into the demodulated output component signals 12, 12', 12". Additional demodulators may be provided for cases with more than three component signals within the input signal.

Although the above described embodiment is a significant advancement over currently practiced techniques, signal separation performance is degraded when the synthesized signals are delayed before subtraction at signed summers 202, 204. In general, the approach is only usable for cases where the delay is a small fraction of the inverse of the demodulator loop bandwidth. Accordingly, the Applicant also discloses the following cascadely-coupled configuration to eliminate this operational limitation.

Figure 3:
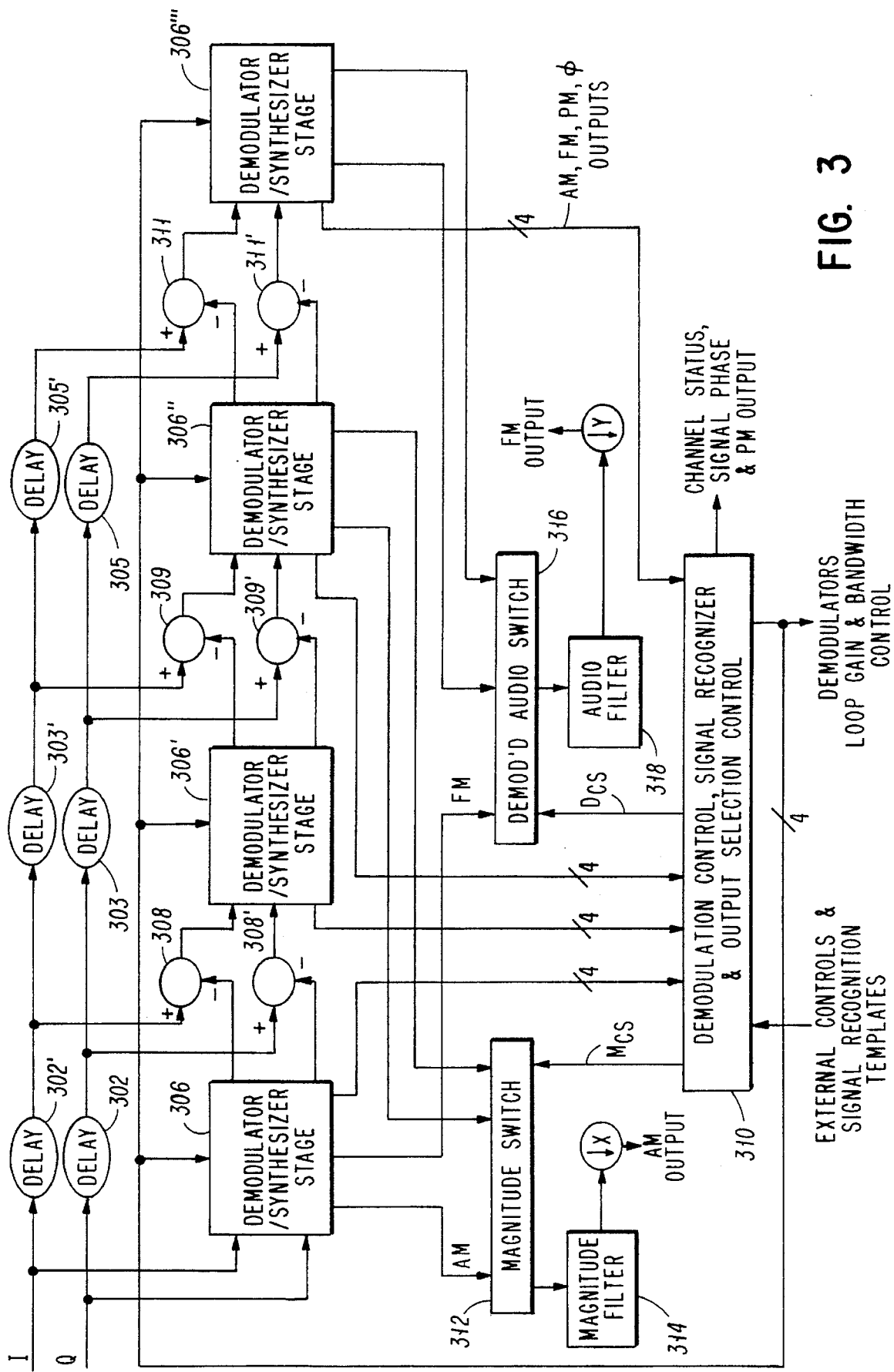
FIG. 3 is a block diagram of a cascadely-coupled receiver apparatus having a plurality of demodulator stages.

FIG. 3 illustrates an alternate embodiment of the apparatus of FIG. 1. An input signal is shown represented by its I and Q component. Both the I component signal and the Q component signal are coupled to means for delaying 302, 302' and to a first demodulator/synthesizer stage 306. The output signals of the demodulator/synthesizer stage 306 are comprised of the following: A modified I component signal I'; a modified Q component signal Q'; a magnitude signal AM; an FM signal; a PM signal; and a carrier phase $\phi$. The modified I and Q component signals I' and Q', are coupled to a pair of signed summers 308, 308'. Signed summer apparatus 308, 308' subtract I' and Q' from the original I and Q value routed to the signed summers 308, 308' via means for delaying 302, 302'. The AM, FM, PM, and $\phi$ outputs from the demodulator/synthesizer stage 306 is coupled to means for accomplishing signal recognition, demodulation control, and selection control 310. The input signals and output signals of additional demodulators 306', 306", 306'" are similarly configured. For a detailed description of such additional demodulator signals and associated summers and delay means, the reader is referenced to the above description and the contents of FIG. 3. The means for accomplishing signal recognition, demodulation control, and output selection control 310 may also have means for external control and signal recognition parametric inputs. The means 310 may also provide external outputs relating to the signals presence status and the PM output and carrier phase of the signal-of-interest. It is understood that the use of four demodulator stages is somewhat arbitrary with regards to the teaching of this disclosure. A minimum number N equal in value to the total number M of signals, interference or noise desired to be processed is required. More optimum performance is achieved when N=gM, where g is the number of cascaded groups of M demodulator/synthesizers. As the value of g is increased, signal separation performance is improved. When M is greater than 2 signals, the signed summers (308, 308', 309, 309', etc.) must combine additional prior stage synthesized outputs, delayed to compensate for the intervening stage(s) process delays. For example, when M=2 signals, the 1 prior stage outputs are subtracted (as shown in FIG. 3). When M=3 signals, the two prior stages outputs are subtracted. In general, when M signals are separated, the prior 'M−1' synthesized output pairs must be appropriately delayed and subtracted from the delayed input signal. Also, the desired demodulated signal outputs can come from any of the first stage and last 'M' stages. The apparatus as shown in FIG. 3 is best suited for one signal-of-interest and one interfering signal (g=2, M=2).

A magnitude switch means 312 receives magnitude signals AM from the first 306 and the last two 306", 306'" demodulator/synthesizer stages and a control signal $M_{cs}$ from signal recognizer, demodulation control, and selection control means 310. The switch 312 routes an AM output selection via means 310 through a filter 314 and on to additional means (not shown) for further processing. Similarly, an audio switch 316 receives FM signals from the first 306 and the last two 306", 306'" demodulators and a control signal $D_{cs}$ from signal recognizer, demodulation control, and selection control means 310. The switch 316 routes an FM output selection via means 310 through a filter 318 and on to additional means (not shown) for further processing.

Figure 4:
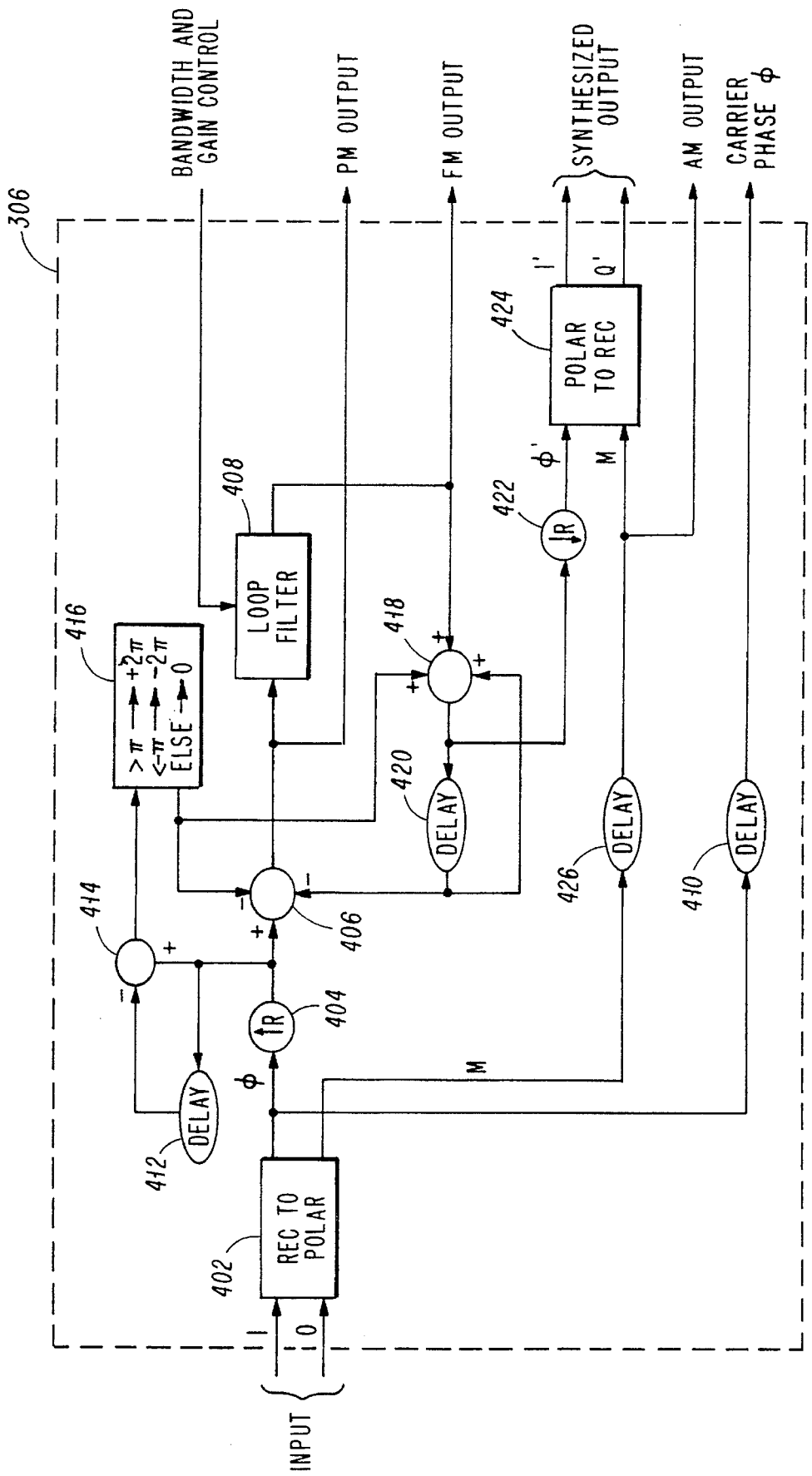
FIG. 4 is a block diagram of one implementation of a phase-locked loop FM demodulator stage of FIG. 3.

FIG. 4 illustrates a demodulator 306, 306', 306", 306'" (see FIG. 3) in block diagram form. The input signal is shown having an I component and a Q component coupled to means for performing rectangular-to-polar conversion 402. The output of means 402 are shown as M representing magnitude and φ representing phase. The φ signal is coupled to a sample rate increaser 404 (only used with sampled signaling), a signed summer 406, through a loop filter 408, and on as an FM output to additional processing means, as described above. Additionally, the φ signal is coupled from means 402 to a delay means 410 and out of the demodulator as carrier phase. A loop comprised of delay means 412, a subtracter 414, and a phase roll over detector 416 is disposed after the sample rate increaser 404 and to the signed summer 406. The FM output signal of filter 408 is also coupled to a summer 418. The summer 418 receives an additional input signal from the phase rollover detector 416, and its own output signal routed through a delay means 420 and back into itself. In addition, the signal delayed by means 420 is input to signed summer 406. The output of signed summer 406 is passed as the PM output. The output signal of the summer 418 is also coupled to means for performing polar-to-rectangular conversion 424, via a sample rate reducer 422 (only used with sampled signals). Means 424 receives an additional input signal M, from means 402 via delay means 426, passed on as the AM output. The demodulator 306, 306', 306", 306'" is shown processing sampled signals although the approach applies equally well to continuous signals (no sample rate adjustment 404, 422 used). For sampled signals, the rate adjust value R is typically 2, but may be more or less.

In operation, the apparatus of FIG. 3 performs similarly to the apparatus illustrated in FIG. 1. However, differences do exist that account for the improved performance in those situations where a cross-coupled arrangement would perform poorly. Process delays can be accurately compensated for resulting in higher degrees of interference suppression in the demodulation outputs. The demodulators 306, 306', 306", 306'" are closely controlled and linked to the corresponding delay means 302 (302'), 303 (303'), 305 (305') so that the signed summers 308 (308'), 309 (309'), 311 (311') are subtracting the cleaned-up demodulator synthesized component signal outputs, from the input signal which is accurately delayed to compensate for the process delay in the prior demodulator stages. The demodulator stages systematically track the separate input component signals and improve the signals separation with each subsequent group of demodulator stages. This ability to improve signal separation performance by adding additional groups of 'M' stages is unique to the arrangement of FIG. 3.

The output signals of each demodulator are also coupled to switching means 312 and 316. The signal recognizer means 310 issues appropriate command signals $M_{cs}$, $D_{cs}$ to switching means 312, 316 in response to received and analyzed FM, AM, PM, and phase (φ) signals from the demodulators 306, 306', 306", 306'".

Those skilled in the art will readily recognize that various modifications and changes may be made to the present invention without departing from the true spirit and scope thereof, which is set forth in the following claims.

I claim:

1. A receiver apparatus for processing arbitrary cochannel composite radio frequency signals in complex baseband form, sharing the same channel with each other or noise, comprising:

a signal input terminal for receiving the radio frequency signals;

a plurality of means for separating and demodulating the radio frequency signals into individual component signal subsets comprised of AM or FM signal components;

means for recognizing said component signal subsets, coupled to and issuing control signals to the demodulating means in response to the evaluated demodulating means output signals; and means for switching the output of each of the said demodulating means into the input of each of the other said demodulating means and on to additional processing means.

2. The apparatus of claim 1, wherein the plurality of means for separating and demodulating the component radio frequency signals from the composite input signal comprises two or more demodulators.

3. The apparatus of claim 2, wherein the demodulators are cross-coupled in a group of two or more, one demodulator for each component signal, with feed-back signal inputs from all other demodulators.

4. The apparatus of claim 2, wherein the demodulators operate using numeric I and Q baseband data samples and digital signal processing.

5. A receiver apparatus for processing arbitrary cochannel composite radio frequency signals in complex baseband form, sharing the same channel with each other or noise, comprising:

- a signal input terminal for receiving the radio frequency signals;
- a plurality of means for separating and demodulating the radio frequency signals into individual component signal subset comprised of AM or FM signal components;
- a plurality of delay means to control timing of the radio frequency signals into the plurality of means for demodulating;
- means for recognizing said component signal subsets, coupled to and issuing control signals to the demodulated means in response to the evaluated demodulating means output signal; and
- means for switching the output of each of the said demodulating means into the input of each of the other said demodulating means and on to additional processing means.

6. The apparatus of claim 5, wherein the plurality of means for separating and demodulating the component radio frequency signals from the composite input signal comprises one or more groups of two or more demodulators.

7. The apparatus of claim 6, wherein the demodulators are cascadely-coupled to each other.

8. The apparatus of claim 6, wherein the demodulators operate in a digital state on sampled signals.

* * * * *